US011158707B2

(12) United States Patent
Melzner et al.

(10) Patent No.: US 11,158,707 B2
(45) Date of Patent: Oct. 26, 2021

(54) TRANSISTOR DEVICE

(71) Applicant: Infineon Technologies AG, Neubiberg (DE)

(72) Inventors: Hanno Melzner, Putzbrunn (DE); Markus Dankerl, Munich (DE); Peter Irsigler, Obernberg/Inn (AT); Sebastian Schmidt, Munich (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/010,668

(22) Filed: Sep. 2, 2020

(65) Prior Publication Data
US 2021/0118992 A1    Apr. 22, 2021

(30) Foreign Application Priority Data

Oct. 17, 2019   (DE) .......................... 102019128071.0

(51) Int. Cl.
   H01L 29/06       (2006.01)
   H01L 29/423      (2006.01)
   H01L 29/43       (2006.01)

(52) U.S. Cl.
   CPC ...... H01L 29/0696 (2013.01); H01L 29/4236 (2013.01); H01L 29/435 (2013.01)

(58) Field of Classification Search
   CPC ......... H01L 29/06; H01L 29/40; H01L 29/43; H01L 29/66; H01L 29/78; H01L 29/417; H01L 29/423; H01L 29/739; H01L 29/0696; H01L 29/66734; H01L 29/66348; H01L 29/435; H01L 29/4236; H01L 29/4238; H01L 29/7396; H01L 29/7397; H01L 29/41766; H01L 29/407;
   (Continued)

(56) References Cited

U.S. PATENT DOCUMENTS

| 2008/0197406 A1* | 8/2008 | Parthasarathy | ..... H01L 29/7813 257/329 |
| 2010/0123220 A1* | 5/2010 | Burke | ................... H01L 29/407 257/630 |
| 2018/0190649 A1 | 7/2018 | Laven | |

FOREIGN PATENT DOCUMENTS

DE           2543138 A1      4/1976

OTHER PUBLICATIONS

Office Action, in the German language, from counterpart German Application No. 102019128071.0, dated May 19, 2020, 10 pp.

* cited by examiner

*Primary Examiner* — Chuong A Luu
(74) *Attorney, Agent, or Firm* — Shumaker & Sieffert, P.A.

(57) ABSTRACT

A transistor device may include a semiconductor body, a plurality of cell regions each comprising a plurality of transistor cells that are at least partially integrated in the semiconductor body and that each comprise a respective gate electrode, a plurality of routing channels each arranged between two or more of the cell regions, a gate pad arranged above a first surface of the semiconductor body, and a plurality of gate runners each coupled to the gate pad and each arranged in one of the plurality of routing channels. Each of the plurality of gate runners may be associated with one of the plurality of cell regions such that the gate electrodes in each of the plurality of cell regions are connected to an associated gate runner, and each of the plurality of routing channels comprises two or more gate runners that are routed in parallel and spaced apart.

17 Claims, 14 Drawing Sheets

(58) Field of Classification Search
CPC ..... H01L 29/7813; H01L 29/04; H01L 29/16; H01L 29/18; H01L 29/22; H01L 29/36; H01L 29/045; H01L 29/185; H01L 29/1608; H01L 29/365; H01L 29/2206; H01L 29/083; H01L 29/0834; H01L 29/7428; H01L 29/1058; H01L 29/1066; H01L 29/7398; H01L 29/66893; H01L 29/66924; H01L 29/66325; H01L 29/7393; H01L 27/02; H01L 27/098; H01L 27/0266; H01L 27/0285; H01L 27/14679
USPC ......................................................... 257/327
See application file for complete search history.

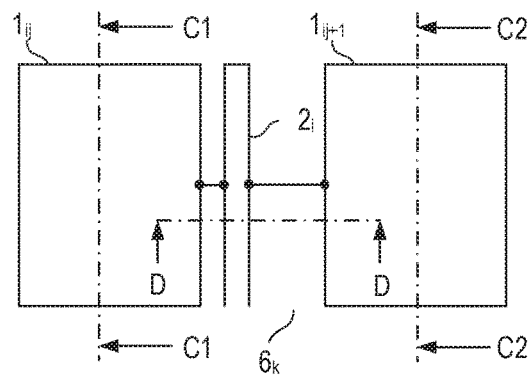
FIG 8A
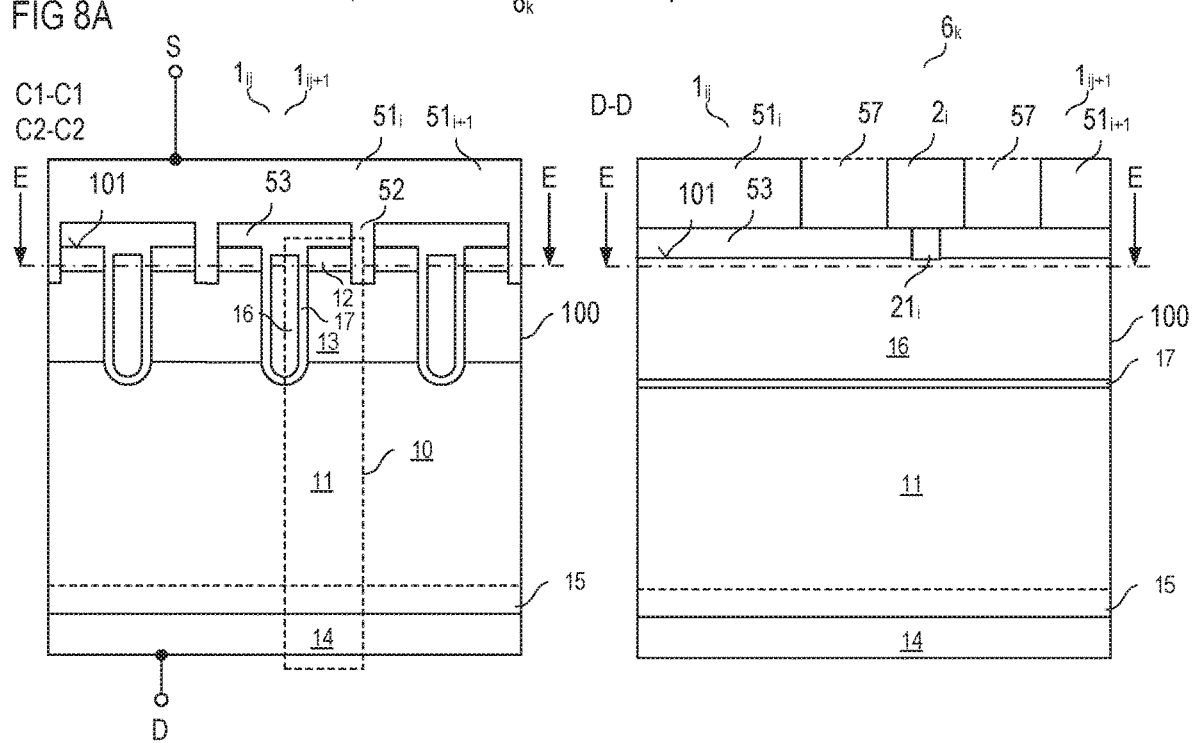
FIG 8B
FIG 8C
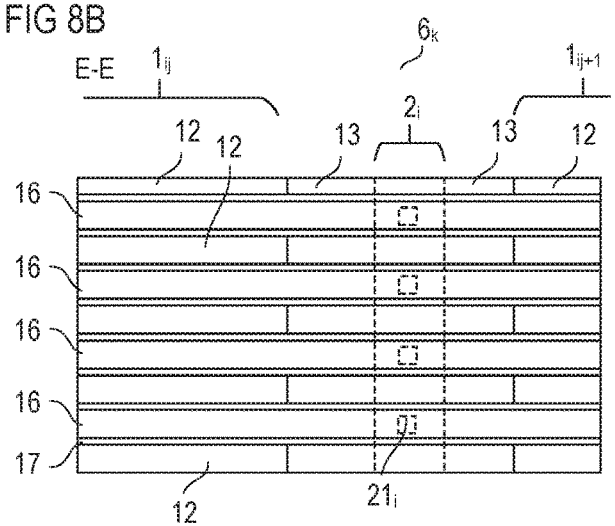
FIG 8D

TRANSISTOR DEVICE

This application claims priority to German Patent Application Number 102019128071.0, filed Oct. 17, 2019, the entire content of which is incorporated herein by reference.

This disclosure relates in general to a transistor device and, more specifically, a transistor with a plurality of transistor cells.

In a transistor device with a plurality of transistor cells, such as a MOSFET or an IGBT, each of the transistor cells includes a gate electrode, wherein a drive voltage received at the gate electrode of each transistor cell governs a switching state of the respective transistor cell, wherein whether a transistor cell switches on or off is dependent on whether a voltage across a gate-source capacitance of the transistor cell is higher or lower than a threshold voltage. The transistor cells receive the drive voltage from a gate pad to which the transistor cells are connected via gate runners, wherein a plurality of transistor cells may be connected to the same gate runner. Inevitably, each gate runner has an electric resistance, wherein a resistance between the gate pad and a respective transistor cell is dependent on a position at which the transistor cell is connected to the gate runner, wherein the resistance increases as a distance between the gate pad and the transistor cell increases. Further, the higher the resistance the longer is a delay time between a time instance at which a voltage level of the drive voltage received at the gate pad changes and a time instance at which the switching state of a respective transistor cell changes. Thus, there may be considerable time delays between time instances at which transistor cells connected to the same gate runner change their switching states. These time delays may cause an overload of those transistor cells that switch on earlier.

There is therefore a need to better control a switching on and off of transistor cells in a transistor device.

One example relates to a transistor device. The transistor device includes a semiconductor body, a plurality of cell regions each including a plurality of transistor cells that are at least partially integrated in the semiconductor body and that each include a respective gate electrode, a plurality of routing channels each arranged between two or more of the cell regions, a gate pad arranged above a first surface of the semiconductor body, and a plurality of gate runners each coupled to the gate pad and each arranged in one of the plurality of routing channels. Each of the plurality of gate runners is associated with one of the plurality of cell regions such that the gate electrodes in each of the plurality of cell regions are connected to an associated gate runner. Further, each of the plurality of routing channels includes two or more gate runners that are routed in parallel and spaced apart from each other.

Another example relates to a transistor device. The transistor device includes a semiconductor body, a plurality of cell regions each including a plurality of transistor cells that are at least partially integrated in the semiconductor body and that each include a respective gate electrode, a gate pad arranged above a first surface of the semiconductor body, and a plurality of gate runners. Each gate runner has a capacitance, a resistance and a propagation delay, the propagation delay being adjustable by adjusting at least one of the capacitance and the resistance, wherein each gate runner of the plurality of gate runners couples the gate electrodes of one of the plurality of cell regions to the gate pad.

Examples are explained below with reference to the drawings. The drawings serve to illustrate certain principles, so that only aspects necessary for understanding these principles are illustrated. The drawings are not to scale. In the drawings the same reference characters denote like features.

FIG. 1 schematically illustrates a top view of a transistor device that includes a gate pad, a plurality of cell regions, and a plurality of gate runners;

FIGS. 8A-8D illustrate transistor cells of two cell regions connected to the same gate runner;

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
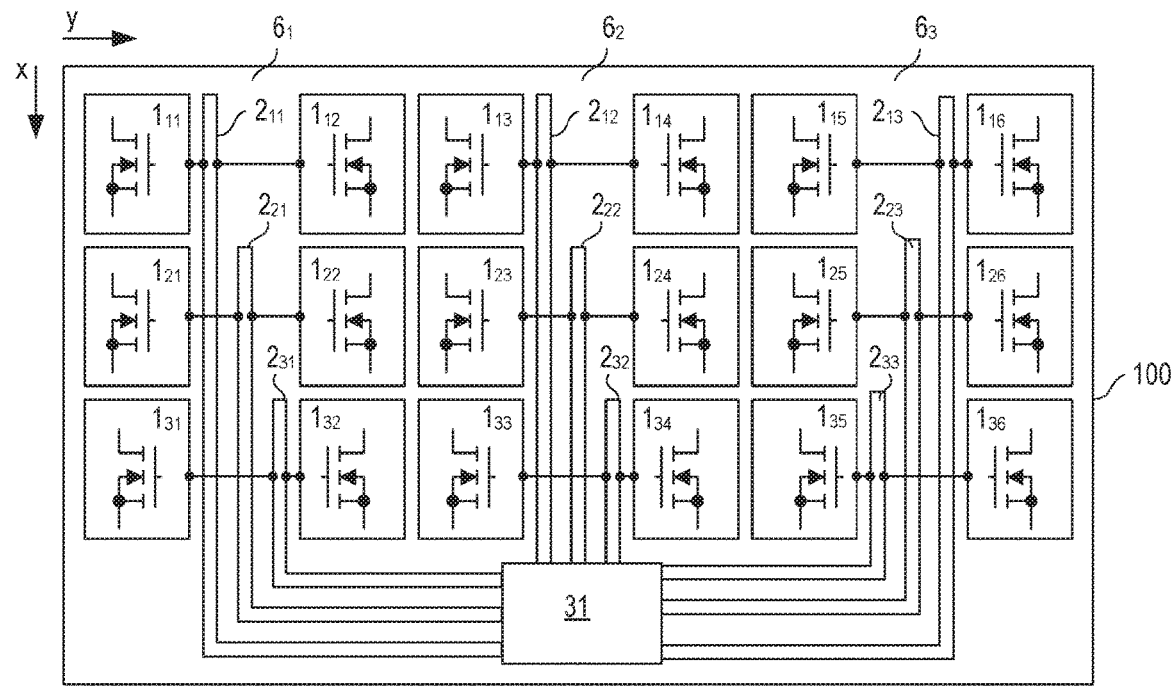

FIG. 1 schematically illustrates a top view of a transistor device according to one example. Referring to FIG. 1 the transistor device includes a semiconductor body 100 and a plurality of cell regions $1_{11}$-$1_{36}$. Each of these cell regions $1_{11}$-$1_{36}$ includes a plurality of transistor cells that are at least partially integrated in the semiconductor body 100 and that each include a respective gate electrode. Transistor cells, however, are not illustrated in detail in FIG. 1. Examples of how these transistor cells may be implemented are explained in detail herein further below. The transistor cells included in each of the cell regions $1_{11}$-$1_{36}$ are schematically illustrated by a circuit symbol of a transistor device in the example shown in FIG. 1. Just for the purpose of illustration, this circuit symbol is the circuit symbol of an n-type enhancement MOSFET. This, however, is only an example. Any other type of transistor device, that is any other type of MOSFET, an IGBT (Insulated Gate Bipolar Transistor), or a JFET (Junction Field-Effect Transistor), to name only a few, may be implemented in the semiconductor body 100 as well.

According to one example, the semiconductor body 100 includes a monocrystalline semiconductor material. Examples of the monocrystalline semiconductor material include, but are not restricted to, silicon (Si), silicon carbide (SiC), gallium arsenide (GaAs), gallium nitride (GaN), or the like.

Referring to FIG. 1, the transistor device further includes a gate pad 31 and a plurality of gate runners $2_{11}$-$2_{33}$. The gate pad 31 is arranged above a first surface of the semiconductor body 100, and each of the gate runners $2_{11}$-$2_{33}$ is coupled to the gate pad 31.

In the following, reference number 1 denotes an arbitrary one of the cell regions $1_{11}$-$1_{36}$ or the plurality of cell regions $1_{11}$-$1_{36}$ when no differentiation between the individual cell regions $1_{11}$-$1_{36}$ is required. Equivalently, reference number 2 denotes an arbitrary one of the gate runners $2_{11}$-$2_{36}$ or the plurality of the gate runners $2_{11}$-$2_{33}$ when no differentiation between the individual gate runners $2_{11}$-$2_{33}$ is required.

Referring to FIG. 1, each of the plurality of gate runners 2 is allocated to (associated with) at least one of the plurality of cell regions 1 such that the gate electrodes of the transistor cells in the at least one of the plurality of cell regions 1 are connected to the allocated (associated) gate runner. In the example shown in FIG. 1, the allocation of a gate runner 2 to a cell region 1 is illustrated by a connection line between the gate runner 2 and the respective at least one cell region 1. In the example shown in FIG. 1, gate runner $2_{11}$, for example, is allocated to cell regions $1_{11}$ and $1_{12}$. That is, gate runner $2_{11}$ is connected to the gate electrodes of the transistor cells included in cell regions $1_{11}$ and $1_{12}$.

Referring to FIG. 1, the transistor device includes a plurality of routing channels 6, which may also be referred to as gate runner regions 6. The gate runners 2 are arranged in these routing channels $6_1$-$6_3$ such that two or more of the gate runners 2 are arranged in each of the gate runner region $6_1$-$6_3$. In the following, reference number 6 is used to denote an arbitrary one or the plurality of gate runner regions $6_1$-$6_3$.

Referring to FIG. 1, the two or more gate runners arranged in each of the gate runner regions $6_1$-$6_3$ are spaced apart from each other and routed in parallel. "Routed in parallel" means that the two or more gate runners in each routing channel, at least in sections, extend parallel to each other.

In the example shown in FIG. 1, the two or more gate runners 2 arranged in each of the routing channels 6 are spaced apart from each other in a lateral direction y. This, however, is only an example. Further, each of the routing channels 6 is arranged between two or more of the cell regions 1.

In the example shown in FIG. 1, at least two of the plurality of cell regions 1 are arranged next to each other in a first lateral direction x of the semiconductor body 100 and have different gate runners allocated thereto. In the example shown in FIG. 1, cell regions $1_{11}$, $1_{21}$, $1_{31}$, for example, are arranged next to each other in the first lateral direction x and each of these cell regions $1_{11}$, $1_{21}$, $1_{31}$ has a different gate runner allocated thereto. That is, cell region $1_{11}$ has gate runner $2_{11}$ allocated thereto, cell region $1_{21}$ has gate runner $2_{21}$ allocated thereto and cell region $1_{31}$ has gate runner $2_{31}$ allocated thereto. Further, the different gate runners allocated to cell regions that are arranged next to each other in the first lateral direction x, at least partially extend in the first lateral direction x of the semiconductor body 100 and are spaced apart from each other in lateral direction y mentioned above. This lateral direction is referred to as second lateral direction of the semiconductor body 100 in the following. The second lateral direction y is different from the first lateral direction x. According to one example, the second lateral direction y is essentially perpendicular to the first lateral direction x.

In the example shown in FIG. 1, even cell regions that are arranged next to each other have different gate runners allocated thereto. Cell regions $1_{11}$ and $1_{21}$, which are arranged next to each other in the second lateral direction y, for example, have different gate runners, gate runner $2_{11}$ in the case of cell region $1_{11}$ and gate runner $2_{21}$ in the case of cell region $1_{21}$ allocated thereto. In particular, those cells regions that are spaced apart from the gate pad 31 by different distances are connected to different gate runners. By allocating different gate runners even to cell regions that are arranged next to each other an electrical resistance between the gate pad 31 and each of the cell regions 1 can be adjusted individually. In this way, a switching behavior of the transistor cells in the individual cell regions 1 can be adjusted individually. This is explained in detail with reference to FIG. 7 herein further below.

Adjusting the resistance between the gate pad 31 and a respective one of the cell regions 1 can be achieved in various ways. In the example shown in FIG. 1, the resistance between the gate pad 31 and each of the cell regions 1 is formed by the respective gate runner 2. In this example, each of the gate runners 2 is directly connected to the gate pad 31 and extends from the gate pad 31 to the respective cell region 1. The resistance of each gate runner 2 is dependent on a length of the gate runner 2 between the gate pad 31 and the respective cell region 1, a cross sectional area of the gate runner 2 in a section plane perpendicular to a longitudinal direction of the gate runner 2, and a resistivity of the material used to implement the gate runner 2. Basically, at a given cross sectional area and a given resistivity, the resistance increases as the length of the gate runner 2 increases. Equivalently, at a given length and a given resistivity, the resistance decreases as the cross-sectional area increases. Further, at a given length and a given cross sectional area, the resistance decreases as the resistivity decreases.

Figure 2:
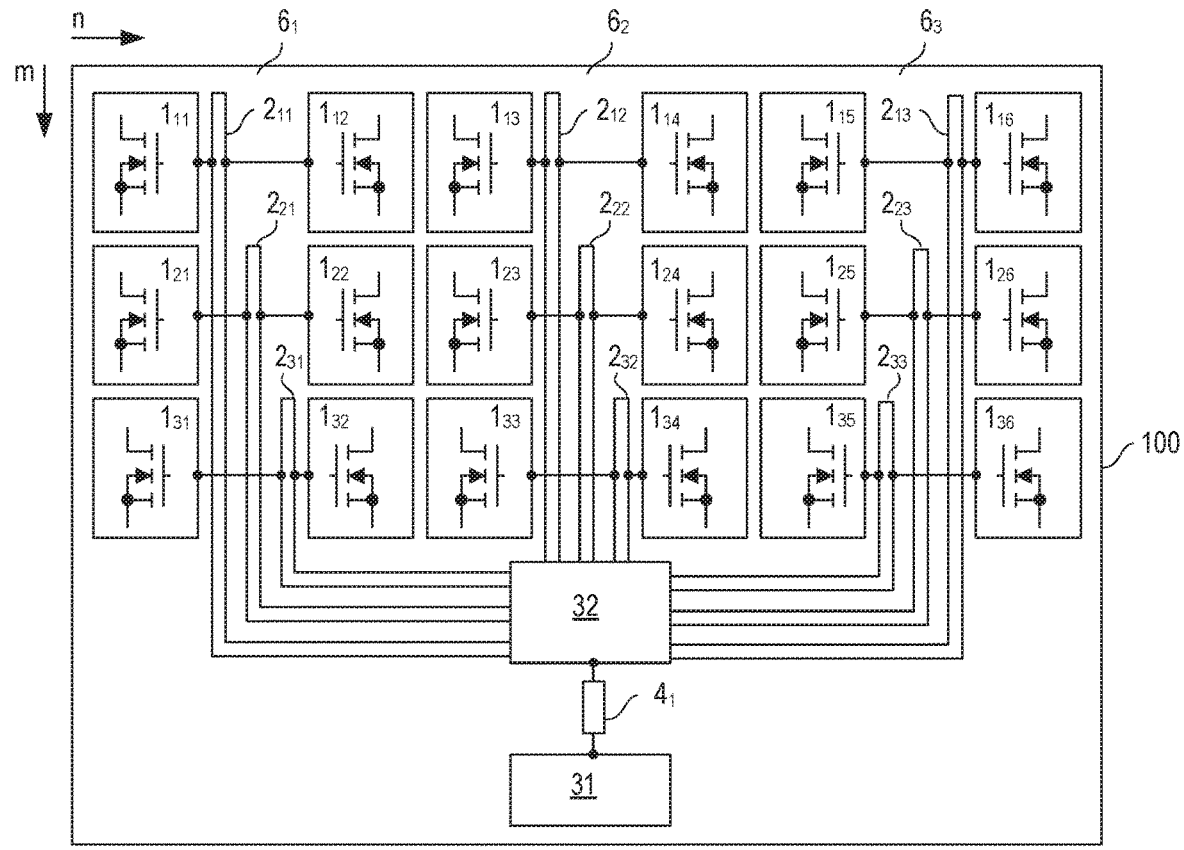
FIG. 2 illustrates a modification of the transistor device shown in FIG. 1.

Another example for adjusting the resistance between the gate pad 31 and the individual cell regions 1 is illustrated in FIG. 2. In this example, the transistor device includes a connection pad 32 and a resistor $4_1$ connected between the connection pad 32 and the gate pad 31. Each of the gate runners 2 is connected to the connection pad 32. In this example, the resistance between the gate pad 31 and each of the cell regions 1 is given by a resistance of the resistor $4_1$ plus a resistance of the gate runner 2 allocated to the respective cell region 1.

Figure 3:
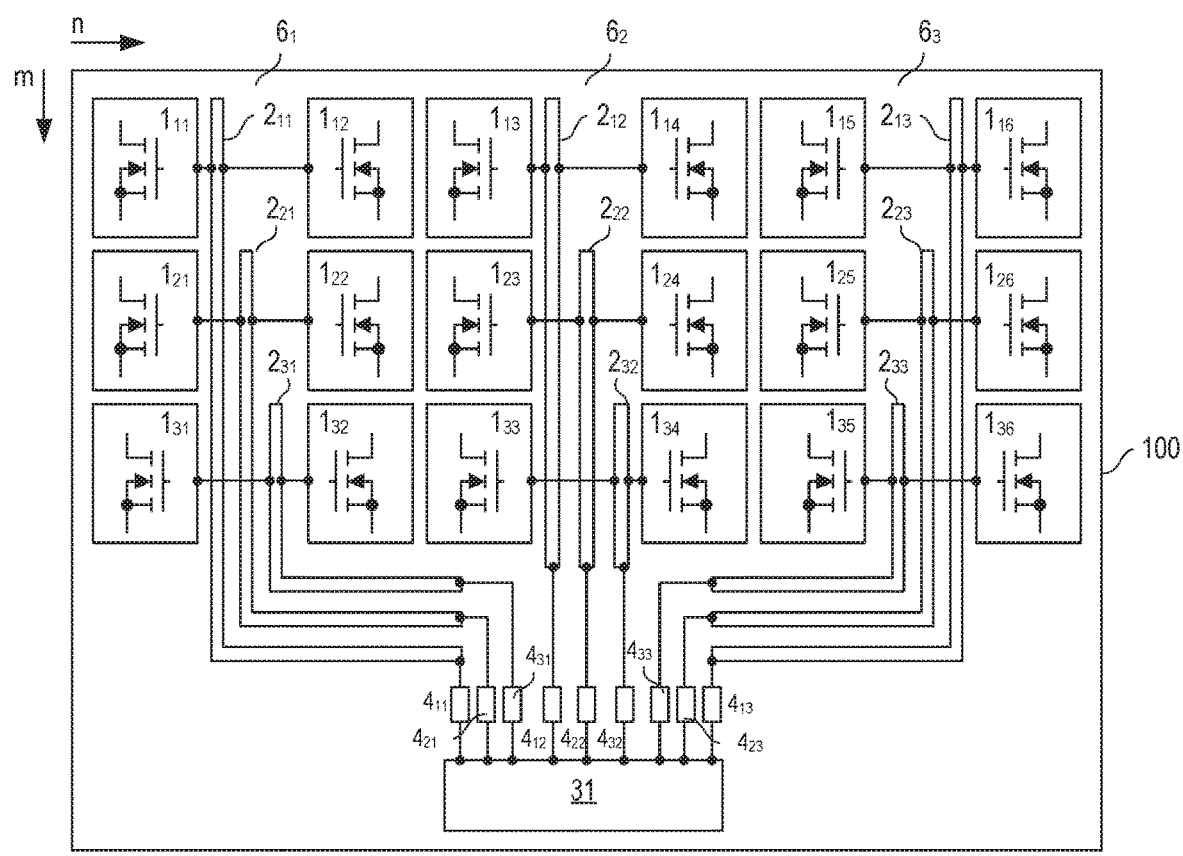
FIG. 3 illustrates a modification of the transistor device shown in FIG. 2.

According to another example illustrated in FIG. 3, an individual resistor $4_{11}$-$4_{33}$ is connected between the gate pad 31 and each of the gate runners $2_{11}$-$2_{33}$. In this example, the resistance between the gate pad 31 and each of the cell regions 1 is given by the resistance of the gate runner allocated to the respective cell region 1 plus a resistance of the respective resistor $4_{11}$-$4_{33}$.

Figure 4A:
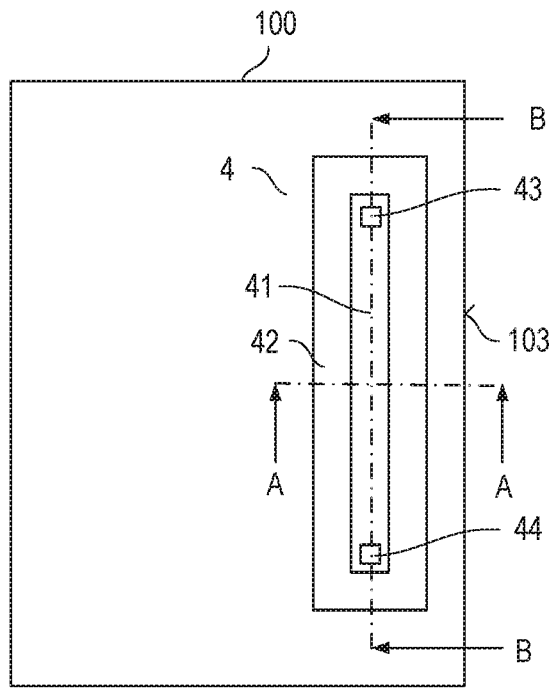
FIGS. 4A-4C illustrate one example of a resistor that may be implemented in the transistor device shown in FIG. 2 or 3.
Figure 4B:
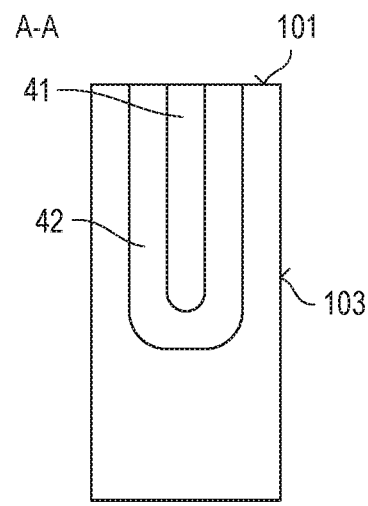
Figure 4C:
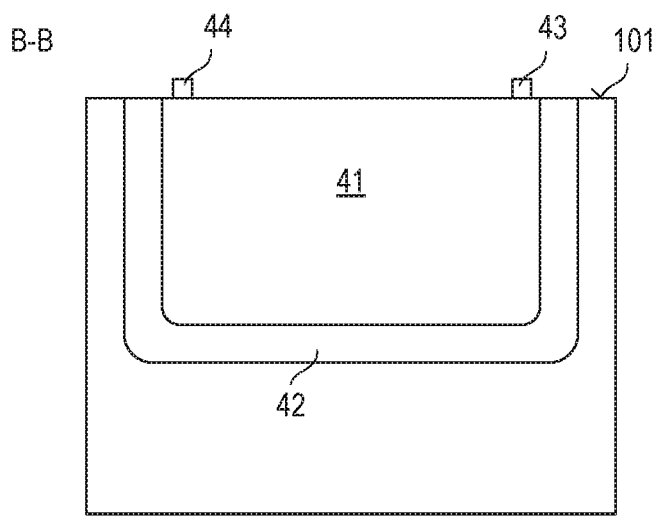

The resistor $4_1$ illustrated in FIG. 2 and the resistors $4_{11}$-$4_{33}$ illustrated in FIG. 3 may be implemented in various ways. One example for implementing one of these resistors $4_1$ or $4_{11}$-$4_{33}$ is illustrated in FIGS. 4A to 4C. In the following, reference number 4 denotes an arbitrary one of the resistors $4_1$, $4_{11}$-$4_{33}$. FIG. 4A illustrates a top view of a region of the semiconductor body 100 in which the resistor 4 is integrated. FIG. 4B shows a vertical cross sectional view in a first section plane A-A of the region in which the resistor 4 is integrated, and FIG. 4C shows a vertical cross sectional view in a second section plane B-B of the region in which the resistor 4 is integrated.

Referring to FIGS. 4A to 4C, the resistor includes a resistive material $4_1$ is arranged in a trench of the semiconductor body 100 and is electrically insulated from surrounding regions of the semiconductor body 100 by an insulation layer 42. According to one example, the insulation layer 42 is an oxide such as a semiconductor oxide. The resistive material 41 is a doped polycrystalline semiconductor material such as polysilicon, for example.

Referring to FIGS. 4A and 4C, the resistor further includes a first contact pad 43 and a second contact pad 44, wherein these contact pads 43, 44 are spaced apart from each other in a lateral direction and serve to connect the resistor 4 to a respective gate runner 2, the gate pad 31 or the connection pad 32. The resistance of the resistor 4 is dependent on a distance between the contact pads 43, 44, the resistivity of the resistive material 41, and a cross sectional area of the resistive material 41 in a direction perpendicular to the direction in which the contact pads 43, 44 are spaced apart from each other. Basically, at a given cross sectional area and a given material, the resistance increases as the distance between the contact pads 43, 44 increases. Further, at a given material and a given distance, the resistance decreases as the cross-sectional area increases.

Figure 5:
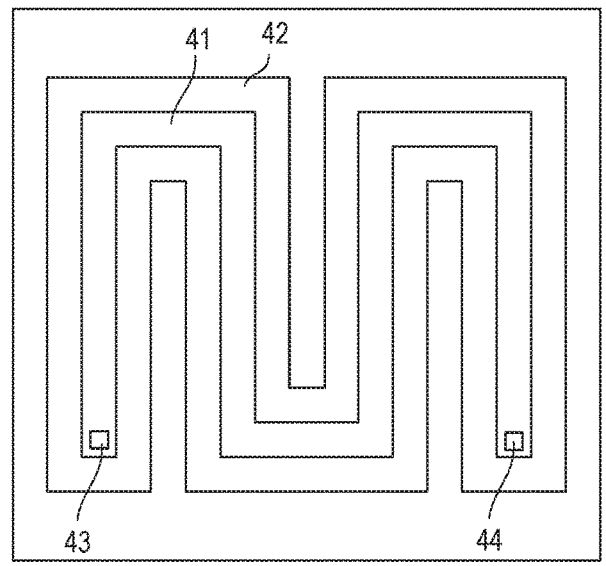
FIG. 5 illustrates another example of the resistor.

Implementing the resistor 4 in the way illustrated in FIGS. 4A to 4C is only an example. Another example of the resistor 4 is illustrated in FIG. 5. In this example, the trench and the resistive material 41 included in the trench are meander-shaped. The first contact pad 41 is arranged in the region of a first end and the second contact pad 44 is arranged in the region of second end of the meander-shaped resistive material 41. In this way, a rather long distance between the contact pads 43, 44 and, therefore, a rather high resistance can be achieved, wherein an area required to implement the resistor 4 is rather small.

Figure 6:
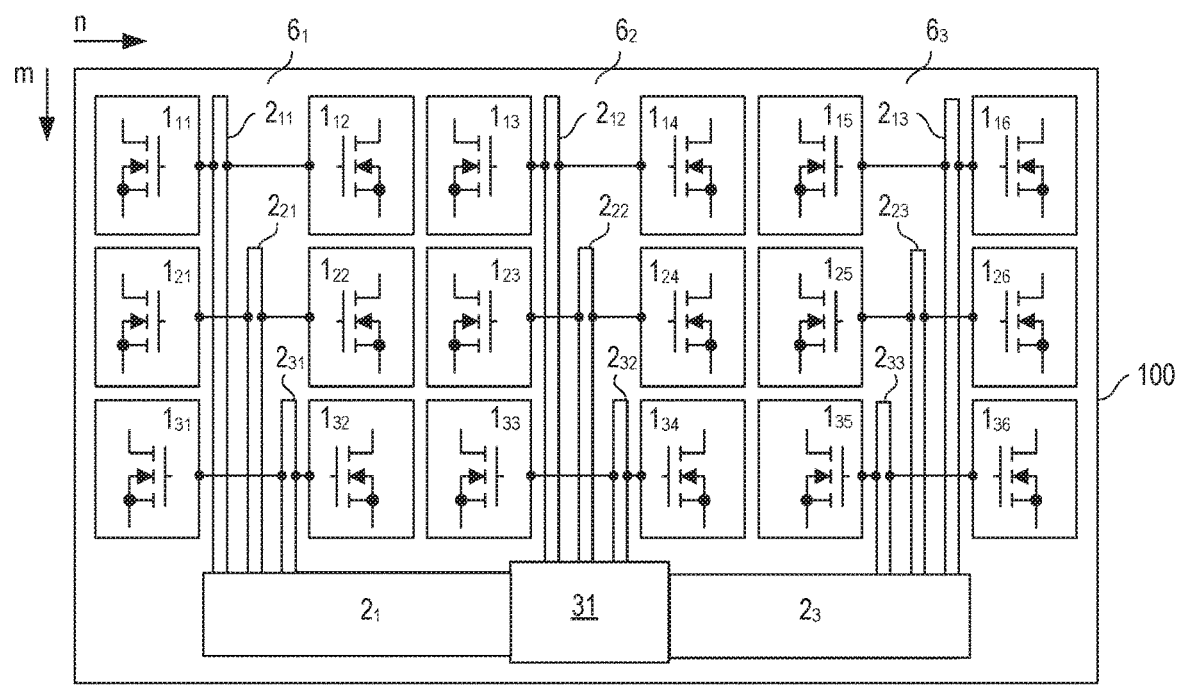
FIG. 6 illustrates a further modification of the transistor device shown in FIG. 1.

FIG. 6 illustrates another example of the transistor device. In this example, some of the gate runners are connected to the gate pad 31 through a connection gate runner $2_1$, $2_3$. More specifically, shown in FIG. 6, gate runners $2_{11}$, $2_{21}$, $2_{31}$ are connected to the gate pad 31 through connection gate runner $2_1$, and gate runners $2_{13}$, $2_{23}$, $2_{33}$ are connected to the gate pad 31 through connection gate runner $2_3$. Further, gate runners $2_{12}$, $2_{22}$, $2_{33}$ are directly connected to the gate pad 31. The connection gate runners $2_1$, $2_3$ may also be used to adjust the resistance between the gate pad 31 and the cell regions 1.

Figure 7:
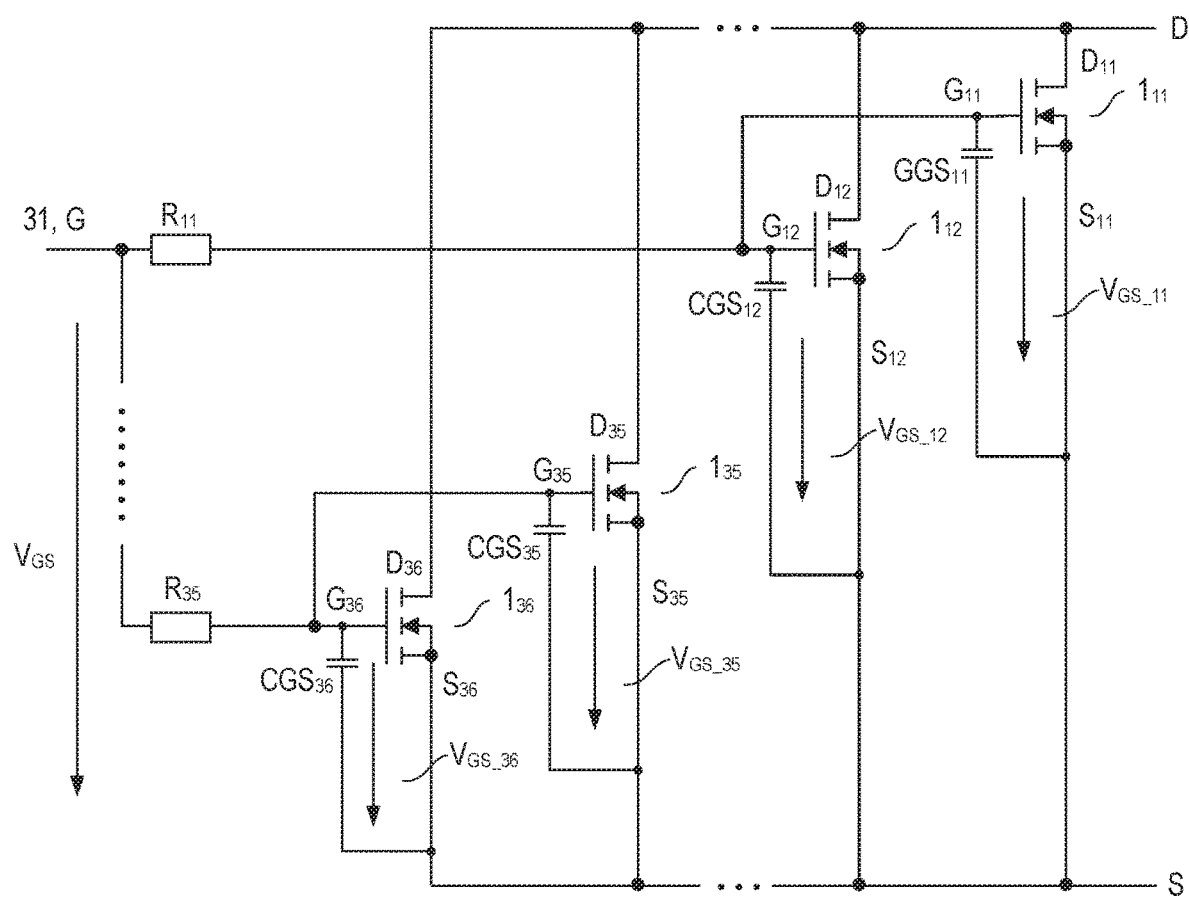
FIG. 7 illustrates an equivalent circuit diagram of the transistor device shown in one of FIG. 1, 2, 5, or 6.

FIG. 7 illustrates an equivalent circuit diagram of the transistor device explained above. Referring to FIG. 7, the transistor device can be considered to be subdivided into a plurality of transistors, wherein each of the transistors is formed by the transistor cells included in the cell regions 1. In the circuit diagram shown in FIG. 7, each of the cell regions $1_{11}$-$1_{36}$, wherein only four $1_{11}$, $1_{12}$, $1_{35}$, $1_{36}$ of the cell regions are illustrated, is represented by one of the transistors. Just for the purpose of illustration, the transistors formed by the respective cell regions are n-type MOSFETs in the example shown in FIG. 7.

Referring to FIG. 7, the transistor device includes a gate node G that is formed by the gate pad 31, a source node S and a drain node. The transistor cells in the individual cell regions $1_{11}$, $1_{12}$, $1_{35}$, $1_{36}$ are connected in parallel. In FIG. 7 this is illustrated in that drain nodes $D_{11}$, $D_{12}$, $D_{35}$, $D_{36}$ of the transistors representing the cell regions are connected to the drain node D of the transistor device and that source nodes $S_{11}$, $S_{12}$, $S_{35}$, $S_{36}$ of the transistors representing the cell regions are connected to the source node S of the transistor device. Gate nodes $G_{11}$, $G_{12}$, $G_{35}$, $G_{36}$ of the transistors representing the cell regions $1_{11}$, $1_{12}$, $1_{35}$, $1_{36}$ are referred to as internal gate nodes in the following. Each of these gate nodes $G_{11}$, $G_{12}$, $G_{35}$, $G_{36}$ represents the gate electrodes of the transistor cells included in the respective cell region $1_{11}$, $1_{12}$, $1_{35}$, $1_{36}$. Each of these internal gate nodes $G_{11}$, $G_{12}$, $G_{35}$, $G_{36}$ is connected to the gate node G of the transistor device, wherein resistors $R_{11}$, $R_{35}$ represent resistances between the gate node G and the internal gate nodes $G_{11}$, $G_{12}$, $G_{35}$, $G_{36}$.

Each of these resistances $R_{11}$, $R_{35}$ can be implemented in various ways. In the example shown in FIG. 1, resistance $R_{11}$, for example, is formed by the gate runner $2_{11}$ that connects cell regions $1_{11}$, $1_{12}$ to the gate pad 31. In the example shown in FIG. 2, resistance $R_{11}$, for example, is formed by the gate runner $2_{11}$ and the additional resistor $4_1$. In the example shown in FIG. 5, resistance $R_{11}$, for example, is formed by the resistance of the gate runner $2_{11}$ and a resistance of additional resistor $4_{11}$. In the example shown in FIG. 6, resistance $R_{11}$, for example, is formed by the resistance of the gate runner $2_{11}$ and a resistance of connection gate runner $2_1$.

Just for the purpose of illustration, in the transistor devices explained before, two cell regions are connected to the gate pad 31 by one and the same gate runner. Gate runner $2_{11}$, for example, connects cell region $1_{11}$ and cell region $1_{12}$ to the gate pad 31. This is also illustrated in the equivalent circuit diagram in FIG. 7 in which both the gate node of the transistor device representing cell region $1_{11}$ and the gate node of the transistor device representing cell region $1_{12}$ is connected to the overall gate node G via resistance $R_{11}$. Equivalently, gate runner 235 connects cell regions $1_{35}$, $1_{36}$ to the gate pad 31.

The transistor device is a voltage-controlled transistor device that switches on or off dependent on a drive voltage $V_{GS}$ received between the gate node G formed by the gate pad 31 and the source node S. More specifically, the transistor cells in the individual cell regions 1 switch on or off dependent on whether internal gate-source voltages $V_{GS\_11}$, $V_{GS\_12}$, $V_{GS\_35}$, $V_{GS\_36}$ received by the individual cell regions $1_{11}$, $1_{12}$, $1_{35}$, $1_{36}$ are higher or lower than respective threshold voltages of the transistor cells. The "internal gate-source voltages" are voltages $V_{GS\_11}$, $V_{GS\_12}$, $V_{GS\_35}$, $V_{GS\_36}$ between the internal gate nodes $G_{11}$, $G_{12}$, $G_{35}$, $G_{36}$ and the source node S.

Referring to FIG. 7, each cell region further includes an internal gate-source capacitance $CGS_{11}$, $CGS_{12}$, $CGS_{35}$, $CGS_{36}$ between the respective internal gate node $G_{11}$, $G_{12}$, $G_{35}$, $G_{36}$ and the source node S. Each of these gate-source capacitances $CGS_{11}$, $CGS_{12}$, $CGS_{35}$, $CGS_{36}$ is formed by gate-source capacitances of the transistor cells included in the respective cell region. Switching on the transistor cells of a cell region $1_{11}$, $1_{12}$, $1_{35}$, $1_{36}$ requires that the respective gate-source capacitance $CGS_{11}$-$CGS_{36}$ is charged such that the internal gate-source voltage $V_{GS\_11}$, $V_{GS\_12}$, $V_{GS\_35}$, $V_{GS\_36}$ is higher than the threshold voltage of the transistor cells of the cell region $1_{11}$, $1_{12}$, $1_{35}$, $1_{36}$. Equivalently, switching off the transistor cells of a cell region $1_{11}$, $1_{12}$, $1_{35}$, $1_{36}$ requires that the respective capacitance $CGS_{11}$-$CGS_{36}$ is discharged such that the internal gate-source voltage $V_{GS\_11}$, $V_{GS\_12}$, $V_{GS\_35}$, $V_{GS\_36}$ is lower than the respective threshold voltage.

In the following, CGS denotes the capacitance of an arbitrary one of the cell regions 1, and R denotes the resistance formed between the gate pad 31 and this cell region. This resistance R is also referred to as gate resistance in the following and at least includes the resistance of the respective gate runner. The gate resistance R and the gate-source capacitance CGS form an RC element. This RC element delays switching on and switching off the transistor cells in the cell regions 1 when the gate-source voltage $V_{GS}$ received by the transistor device changes. More specifically, when the gate-source voltage $V_{GS}$ changes from an off-level to an on-level, the gate-source capacitances of the cell regions 1 have to be charged via the gate runner resistances R to above the threshold voltage of the transistor cells before the transistor cells switch on. Equivalently, when the gate-source voltage $V_{GS}$ changes from the on-level to the off-level the gate-source capacitances CGS of the cell regions 1 have to be discharged via the gate runner resistances R to below the threshold voltage before the transistor cells of the cell regions 1 switch off.

The threshold voltages of the transistor cells can be adjusted by the design of the transistor cells, wherein, according to one example, the transistor cells of the transistor device are implemented such that they essentially have the same threshold voltage. Further, the gate-source capacitance of each transistor cell is dependent on the design of the respective transistor cells. According to one example, the transistor cells of the transistor device are implemented such that they essentially have the same gate-source capacitance. In this case, the gate-source capacitance CGS of one cell region 1 is essentially proportional to the number of transistor cells included in the respective cell region 1.

Referring to the above, the gate resistances R can be adjusted. By suitably adjusting the gate runner resistances R, the RC elements associated with the individual cell regions 1 can be adjusted. In this way, switching delays of the individual cell regions 1 can be adjusted. Each RC element associated with a cell region has an RC time constant, wherein this RC time constant is given by the gate runner resistance associated with the cell region and the gate-source capacitance CGS associated with the cell region. The RC time constant of cell region $1_{11}$ in FIG. 7, for example, is given, by $R_{11} \cdot CGS_{11}$, where $R_{11}$ denotes the gate resistance and $CGS_{11}$ denotes the gate-source capacitance. Further, for example, the RC time constant associated with the cell region $1_{12}$ is given by $R_{11} \cdot CGS_{12}$, where $R_{11}$ denotes the gate resistance and $CGS_{12}$ denotes the gate-source capacitance. In the example shown in FIG. 7, two cell regions have the same gate runner resistance. This, however, is only an example. It is also possible to implement the cell regions such that each of the cell regions is connected to the gate pad 31 through a gate runner that is only (exclusively) connected to the respective cell region. In this case, the RC time constant of each cell region 1 can be adjusted. According to one example, the gate runner resistances R are implemented such that the RC time constants of the individual cell regions deviate less than 20%, less than 10%, or even less than 5% from an average RC time constant. In this case, the switching delay is essentially the same for each of the cell regions, so that the transistor cells in the individual cell regions 1 essentially switch on or off at the same time. This, however, is only an example. By suitably selecting the gate runner resistances it is also possible to have individual cell regions switch on or off faster than other ones of the cell regions. This is explained in the following.

Transistor devices are often used as electronic switches. In some applications it is desired that the transistor device rapidly switches on or off. This, may result in rapid changes of a current through the transistor device and a voltage across the transistor device, wherein this may result in EMI (Electromagnetic Interferences). In order to avoid or reduce EMI it is desired, in some applications, that the transistor device switches in such a way that the current through the transistor device changes rather slowly. This may be achieved by implementing the gate runner resistances such that at least one of the cell regions switches slower than the other cell regions. The latter may be achieved, for example, by implementing the gate runner resistance of the slower switching cell region higher than the gate runner resistances of the other cell regions. In this case, the transistor cells of the at least one cell region with the higher gate runner resistance switch on or off slower than the transistor cells of the other cell regions. In this way, it takes longer for the overall transistor device to change from a switching state in which each of the transistor cells is switched off (is switched on) to a switching state in which each of the transistor cells is switched on (is switched off).

Switching on and switching off the transistor cells is associated with switching losses. Basically, these losses increase as the switching speed of the transistor cells decreases. According to one example, the at least one cell region that has a higher RC time constant than the other cell regions and which, therefore, has higher switching losses is arranged near an edge region of the semiconductor body 100, from where heat associated with the switching losses may be dissipated better than from an inner region of the semiconductor body 100.

In addition to the gate runner resistance, each gate runner 2 may include a gate runner capacitance relative to the source node S. This capacitance can be considered to be distributed along the length of the gate runner, so that the gate runner 2 can be considered to include a plurality of RC elements connected in series, wherein each of these RC elements includes a portion of the gate runner resistance and a portion of the gate runner capacitance. This series circuit of RC elements causes a propagation delay between a time instance of a change of the electrical potential at the gate pad 31 and a time instance at which the change of the electrical potential is received at the gate electrodes of the transistor cells of the respective cell region 1. This propagation delay adds to the delay time caused by the resistance of the gate runner 2 and the gate source-capacitance CGS explained above. In each case, an overall delay time between a change of the electrical potential at the gate pad 31 and a respective change of the switching state of the transistor cells in one cell region 2 can be adjusted by suitably designing the gate runner capacitance and the gate runner resistance of the gate runner 2 connected to the respective cell region 2.

According to one example, the gate runners 2 are implemented such that the propagation delay of each gate runner 2 deviates less than 20%, less than 10%, or less than 5% from an average propagation delay of the gate runners.

In addition to being able to precisely adjust the switching behavior of the transistor cells in the individual cell regions 1, implementing the gate runners 2 in the way explained above may help to implement the overall gate runner arrangement more space saving than conventional gate runner arrangements. This is explained in the following.

In a conventional gate runner arrangement, for example, a plurality of cell regions (more than two cell regions) are connected to the same gate runner. In order to avoid a significant difference in the RC time constants of the cell regions connected to the same gate runner, the gate runner is usually implemented with a very low resistance which, in turn, requires a lot of space on the semiconductor body. In many cases, a resistor is implemented between the gate pad and the low-ohmic gate runner in order to adjust the switching speed of the transistor device.

By implementing the gate runners 2 such that only one or two cell regions 1 are connected to the same gate runner 2, the resistance of the respective gate runner 2 only needs to be adapted to the desired switching behavior of the associated cell region(s). An additional resistor between the gate pad 31 and the gate runner 2 may be omitted (as illustrated in Figure) and the desired resistance between the gate pad 31 and the cell region 1 may be achieved by suitably designing the gate runner 2, wherein the higher the resistance the smaller the space required to implement the gate runner 2. In other examples (see FIGS. 2 and 3, for example) resistances of additional resistors may be reduced as compared to a conventional gate runner design, which also reduces the space consumption.

FIGS. 8A to 8D illustrate one example of how the transistor cells may be implemented. More specifically, FIG. 8A shows a top view of two cell regions $1_{ij}$, $1_{ij+1}$ connected to the same gate runner $2_i$. Cell regions $1_{ij}$, $1_{ij+1}$ shown in FIG. 8A represent an arbitrary pair of cell regions connected to the same gate runner, such as, for example, cell regions $11_{11}$, $11_{12}$ connected to gate runner $2_{11}$, cell regions $1_{21}$, $1_{22}$ connected to gate runner $2_{21}$, and so on. Cell region $1_{ij}$ is also referred to as first cell region and cell region $1_{ij+1}$ is also referred to as second cell region in the following.

FIG. 8B shows a horizontal cross-sectional view of the first cell region $1_{ij}$ in a section plane C1-C1 and of the second cell region $1_{ij+1}$ in a section plane C2-C2. These section planes C1-C1, C2-C2 are essentially parallel to a longitudinal direction of the gate runner $2_i$. FIG. 8C shows a vertical cross sectional view through a section of the first cell region $1_{ij}$, the second cell region $1_{ij+1}$ and the gate runner 2 in a section plane D-D. FIG. 8D shows a horizontal cross sectional view in a section plane E-E extending through the first cell region $1_{ij}$, the second cell region $1_{ij+1}$ and a gate runner region $6_k$ between the first and second cell regions $1_{ij}$, $1_{ij+1}$.

One example of the transistor cells that may be implemented in the first and second cell regions $1_{ij}$, $1_{ij+1}$ is illustrated in FIG. 8B. Referring to FIG. 8B, each cell region includes a plurality of transistor cells 10, wherein each of these transistor cells 10 includes a drift region 11, a source 12, a body region 13 arranged between the drift region 11 and the source region 12, and a drain region 14, wherein the drift region 11 is arranged between the body region 13 and the drain region 14. Optionally, a field-stop region 15 is arranged between the drain region 14 and the drift region 11. Further, the transistor cell 10 includes a gate electrode 16 that is arranged adjacent the body region 13 and separated from the body region 13 by a gate dielectric 17. The transistor cell 10 is a vertical transistor cell in this example. That is, the source region 12 and the drain region 14 are spaced apart from each other in a vertical direction of the semiconductor body 100, wherein the vertical direction is a direction perpendicular to a first surface 101. The first surface 101 is the surface on top of which the gate pad 31 (not shown in FIG. 8B) is arranged.

Referring to FIG. 8B, The drain region 14 of the transistor cells of each cell region $1_{ij}$, $1_{ij+1}$ may be formed by one contiguous semiconductor region, and the drift region 11 of the transistor cells 10 of each cell region $1_{ij}$, $1_{ij+1}$ may be formed by one contiguous semiconductor region. Further, the gate electrodes 16 of two transistor cells may be formed by one electrode, and the body regions of two (other) transistor cells 10 may be formed by one semiconductor region.

Referring to FIG. 8B, the drain regions 14 of the transistor cells 10 are connected to the drain node D of the transistor device. According to one example, on contiguous semiconductor region forms the drain regions of each of the transistor cells of the transistor device. In this case, this semiconductor region may form the drain node or be connected to the drain node of the transistor device.

In the example shown in FIG. 8B, the transistor cells 10 are trench transistor cells. That is, the gate electrode 16 is arranged in a trench that extends from the first surface 101 into the semiconductor body 100. This, however, is only an example. According to another example (not shown) the transistor cells are planar transistor cells. In this case, the gate electrode is arranged above the first surface of the semiconductor body.

The gate-source capacitance of the transistor cell 10 is the capacitance between the gate electrode 16 and the source region 12. This capacitance, inter alia, is dependent on a thickness and a material of the gate dielectric 17 and is dependent on how much the gate electrode 16 and the source region 12 overlap. The threshold voltage of the transistor cell 10 is, inter alia, dependent on a doping concentration of the body region 13.

The transistor device can be implemented as an n-type transistor device or a p-type transistor device. In an n-type transistor device, the source region 12 and the drift region 11 are n-doped and the body region 13 is p-doped. In a p-type transistor device, the source region 12 and the drift region 11 are p-doped and the body region 13 is n-doped. Further, the transistor device can be implemented as an enhancement device or as a depletion device. In an enhancement device, the body region 13 adjoins the gate dielectric 17 (as illustrated in FIG. 8B). In a depletion device, the transistor cell 10 additionally includes a channel region of the same doping type as the source region 12 and the drift region 11, wherein this channel region extends along the gate dielectric 17 between the source region 12 and the drift region 11 (not shown in FIG. 8B). Further, the transistor device can be implemented as a MOSFET (Metal Oxide Semiconductor Field-Effect Transistor) or as an IGBT (Insulated Gate Bipolar Transistor). In a MOSFET, the drain region 14 has the same doping type as the source region 12 and the drift region 11. In IGBT the drain region 14 has a doping type complementary to the doping type of the source region 12 and the drift region 11. (In an IGBT, the drain region 14 is also referred to as collector region).

Referring to FIG. 8B, the source region 12 of each transistor cell 10 of each cell region is connected to a respective source electrode $51_i$, $51_{i+1}$ arranged above the first surface 101 of the semiconductor body 100. Referring to FIG. 8B, the source electrodes $51_i$, $51_{i+1}$ may be arranged on top of an insulation layer 53 formed on the first surface 101 of the semiconductor body 100, wherein electrically conducting vias 52 extend from the source electrodes $51_i$, $51_{i+1}$ through the insulation layer 53 to the source regions 12 and body regions 13 in order to connect the source and body regions 12, 13 to the source electrodes $51_i$, $51_{i+1}$.

Referring to FIG. 8C, the source electrode $51_i$ connected to the transistor cells of the first cell region $1_{ij}$ is spaced apart from the source electrode $51_{ij+1}$ connected to the transistor cells of the second cell region $1_{ij+1}$. The gate runner $2_i$ is arranged between these source electrodes $51_i$, $51_{i+1}$ and spaced apart from these source electrodes $51_i$, $51_{i+1}$. Further, an insulation layer 57 may be arranged in a space between the gate runner $2_i$ and the source electrodes $51_i$, $51_{i+1}$. The insulation layer 57 includes an electrically insulating material and may include at least one of an oxide, a nitride, an imide, or combinations thereof.

Referring to FIG. 8D, the gate electrodes 16 may be elongated electrodes, wherein each of these gate electrodes 16 may extend from the first cell regions $1_{ij}$ through the gate runner region $6_k$ to the second cell region $1_{ij+1}$, so that there are one or more transistor cells in the first cell region $1_{ij}$ and one or more transistor cells in the second cell region $1_{ij+1}$ that have the same gate electrode 16. The body regions 13 may extend from the first cell region $1_{ij}$ through the gate runner region $6_k$ to the second cell region $1_{ij+1}$, wherein the source regions 12 may not extend into the gate runner region $6_k$.

Referring to FIGS. 8C and 8D, the gate runner 2 is connected to the gate electrodes 16 in the gate runner region $6_k$ (wherein in FIG. 8D, the position of the gate runner is illustrated in dashed lines). Referring to FIG. 8C, the gate runner 2 may be arranged above the insulation layer 53 and connected to the individual gate electrodes 16 through electrically conducting vias $21_i$ that extend through the insulation layer 53 from the gate runner 2 to the gate electrodes 16. According to one example, as illustrated in FIG. 8D, the longitudinal direction of the gate runner 2 is essentially perpendicular to longitudinal directions of the gate electrodes 16.

The internal gate source voltages of the cell regions $1_{ij}$, $1_{ij+1}$ illustrated in FIGS. 8A-8D are voltages between the gate runner $2i$ and the source electrodes $51_i$, $51_{i+1}$, wherein the source electrodes $51_i$, $51_{i+1}$ are connected to the source node of the transistor. The latter is explained herein further below. The transistor cells included in the cell regions $1_{ij}$, $1_{ij+1}$ are in an on-state or an off-state dependent on the internal gate source voltage received between the gate runner 2 and the respective source electrode $51_i$, $51_{i+1}$. The transistor cells are in an on-state when the internal gate source voltage causes a conducting channel in the body region 13 along the gate dielectric 17, and the transistor cells are in an off-state when the internal gate source voltage is such that there is no such conducting channel. Transistor cells of an n-type enhancement transistor device, for example, are in the on-state when the internal gate-source voltage is at a positive voltage higher than a threshold voltage.

Figure 9:
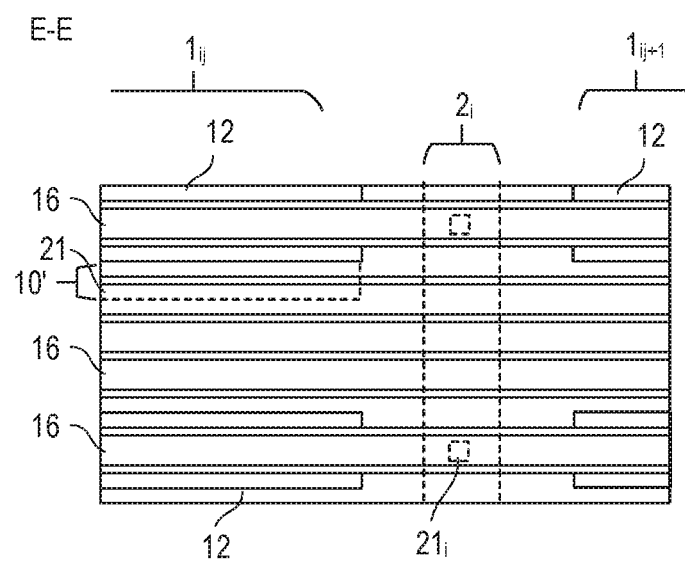
FIG. 9 illustrates a modification of the transistor cells shown in FIG. 8D.

In the example illustrated in FIGS. 8B to 8D, each of the first and second cell regions $1_{ij}$, $1_{ij+1}$ only includes active transistor cells. That is, each transistor cell includes a source region 12 connected to the respective source electrode $51_i$, $51_{i+1}$ and a gate electrode 16 connected to the gate runner $2_i$. This, however, is only an example. According to another example illustrated in FIG. 9, each cell region may include one or more inactive transistor cells 10' arranged between active transistor cells. The inactive transistor cell 10' is different from the active transistor cell 10 in that it does not include a source region 12. Further, inactive transistor cells 10' have their respective gate electrode 16 not connected to the gate runner $2_i$.

Figure 10A:
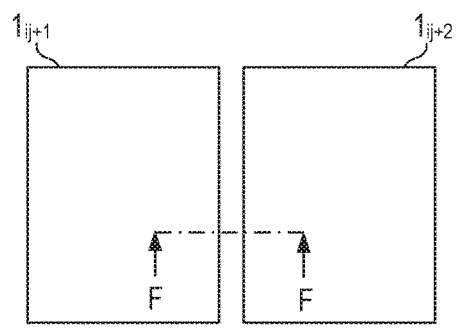
FIGS. 10A-10C illustrate a vertical cross sectional view and a horizontal cross sectional view, respectively, of one section of the transistor device in which two cell regions adjoin each other.
Figure 10B:
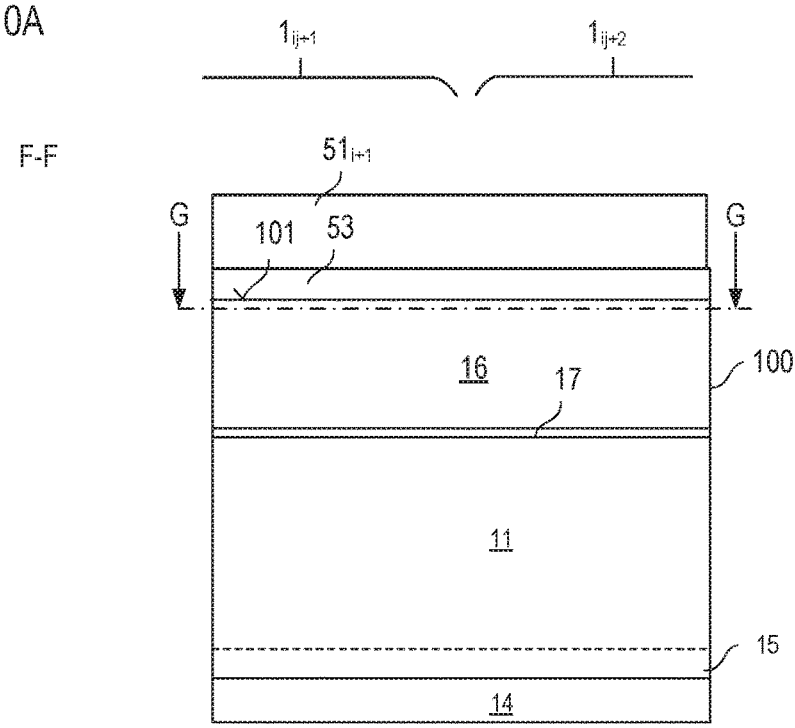

FIG. 10A schematically illustrates a top view of two neighboring cell regions $1_{ij+1}$, $1_{ij+2}$ that are connected to different gate runners. Examples of these cell regions $1_{ij+1}$, $1_{ij+2}$ are cell regions $1_{12}$, $1_{13}$ illustrated in FIGS. 1-3 and 6, cell regions $1_{22}$, $1_{23}$, cell regions $1_{32}$, $1_{33}$, and so on. Cell region $1_{ij+1}$ is referred to as second cell region and cell region $1_{ij+2}$ is referred to as third cell region in the following. FIG. 10B shows a vertical cross-sectional view of these cell regions $1_{ij+1}$, $1_{ij+2}$ in a vertical section plane F-F, and FIG. 10C shows a horizontal cross-sectional view in a section plane G-G shown in FIG. 10B.

Figure 10C:
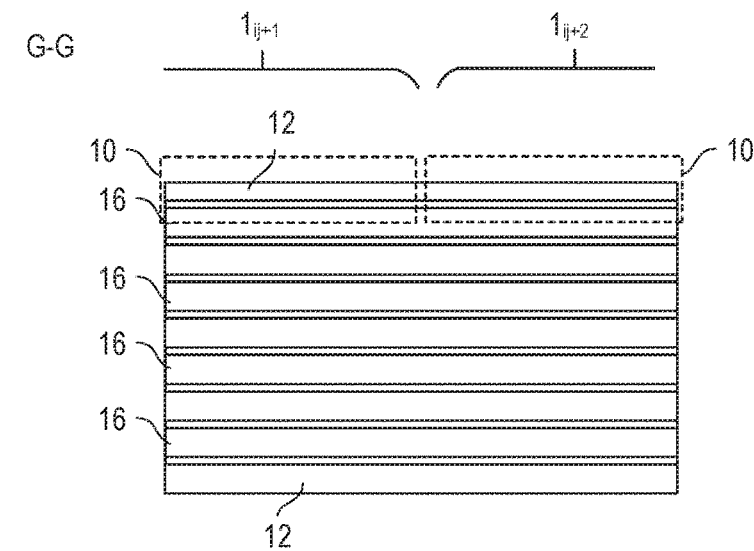

Referring to FIGS. 10B and 10C, one or more transistor cells 10 in the second cell region $1_{ij+1}$ and one or more transistor cells in the third cell region $1_{ij+2}$ may have the same gate electrode 16 and the same source region 12 and may be connected to the same source electrode $51_{i+1}$. Thus, through the gate electrodes 16, there is an electrically conducting connection between the gate runner connected to the second cell region $1_{ij+1}$ and the gate runner connected to the third cell region $1_{ij+2}$. In this case, there is no structural border between the second and third cell regions $1_{ij+1}$, $1_{ij+2}$ or between the transistor cells of the second cell region $1_{ij+1}$ and the transistor cells of the third cell region $1_{ij+2}$. However, there is a functional border between these second and third cell regions $1_{ij+1}$, $1_{ij+2}$, as explained below.

The elongated gate electrodes 16 are comprised of an electrically conducting material, such as a doped polysilicon or a metal, and have an electrical resistance. Referring to the above, a transistor cell switches on or off dependent on a voltage between the gate electrode 16 and the source region 12, wherein, in the on-state of a transistor cell, there is a conducting channel in the body region 13 along the gate dielectric 17 and, in the off-state, the conducting channel is interrupted. Due to the resistance of the gate electrode 16, the conducting channel does not form or is not interrupted at the same time at each position along the gate electrode 16 when the gate-source voltage $V_{GS}$ received by the transistor device changes and, therefore, when the electrical potential of the gate runners 2 changes. Instead, when the electrical potential of the gate runners 2 changes the operating state (on-state or off-state) of the transistor cells first changes at positions close to the gate runners from where the change of the operating state "propagates" to positions more distant to the gate runners 2. In the case that a gate electrode 16 is connected to two (or more) gate runners 2 the gate electrode 16 and the respective transistor cell 10 can be considered to be subdivided in two sections, a first section that is closer to a first one of the gate runners and the operating state of which is governed by the first gate runner, and a second section that is closer to a second one of the gate runners and the operating state of which is governed by the second gate runner. A "border" between these two sections of the transistor cell can be considered as a border between two cell regions 1.

Figure 11A:
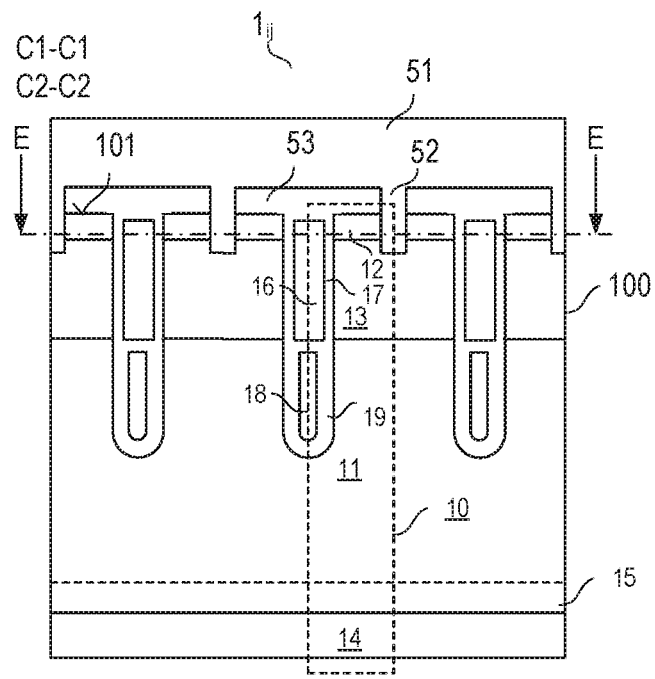
FIGS. 11A-11B illustrate transistor cells according to a further example, wherein these transistor cells each include a field electrode.
Figure 11B:
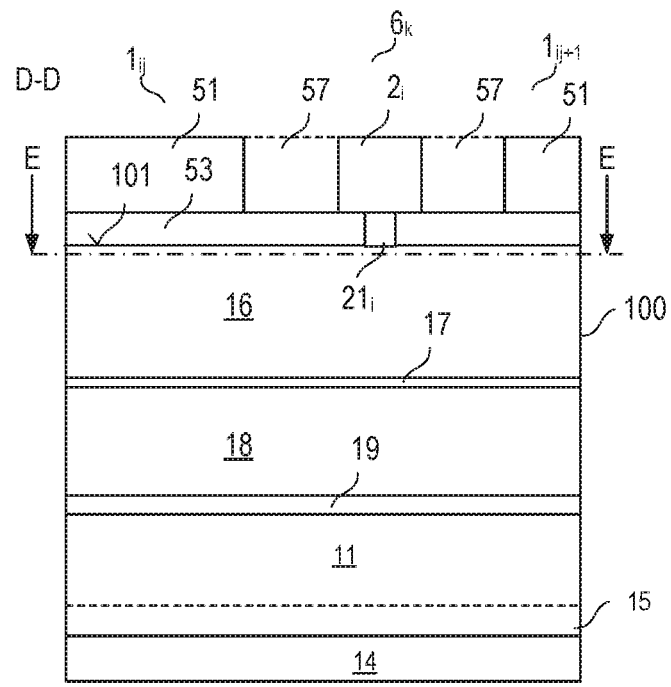

FIGS. 11A and 11B illustrate another example of the transistor cells 10. In this example, each transistor cell additionally includes a field electrode 18 that is dielectrically insulated from the drift region 11 by a field electrode dielectric 19. FIG. 11A illustrates the transistor cells in vertical section planes C1-C1, C2-C2 explained with reference to FIG. 8B, and FIG. 11B illustrates the transistor cells in section plane D-D explained with reference to FIG. 8C. In the example illustrated in FIGS. 11A and 11B, the field electrodes 18 are arranged in the same trenches as the gate electrodes 16. Further, referring to FIG. 11B, the field electrodes 18 extend from the first cell region $1_{ij}$ through the gate runner $6_k$ region into the second cell region $1_{ij+1}$.

The field electrodes 18 may be connected to the gate node G of the transistor device or to the source node S of the transistor device. Corresponding connections, however, are not illustrated in FIGS. 11A and 11B. According to one example, the field electrodes 18 are connected to the source node S through the source electrodes 51. This is illustrated in FIGS. 13A and 13B, wherein FIG. 13A illustrates a vertical cross sectional view of the semiconductor body 100 in the section plane F-F explained with reference to FIG. 10A and FIG. 13B illustrates a horizontal cross sectional view in the section plane G-G shown in FIG. 13A and explained with reference to FIGS. 10B and 10C.

Figure 12:
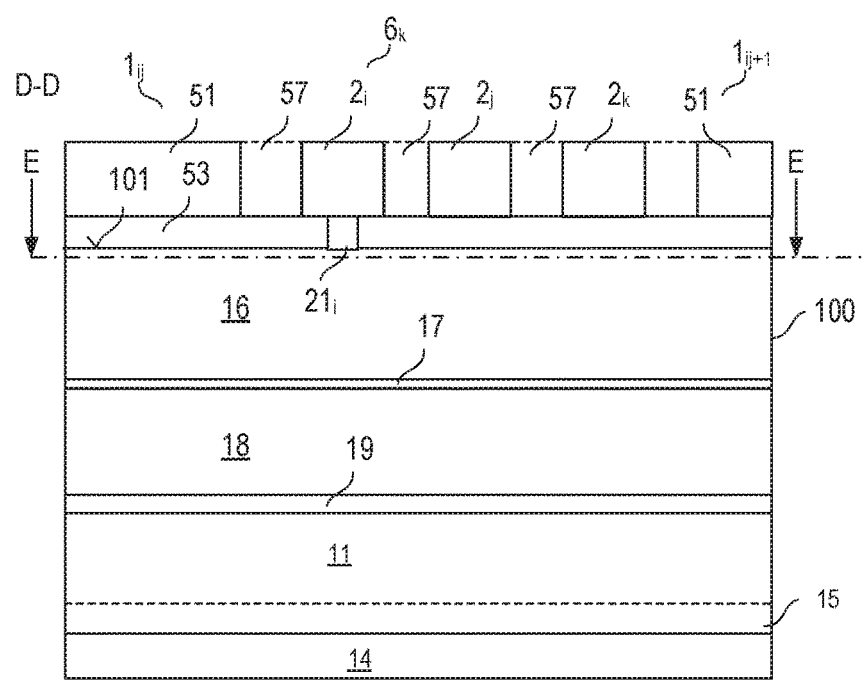
FIG. 12 illustrates a vertical cross sectional view of several gate runners and two neighboring cell regions.

FIG. 8A shows a top view and FIGS. 8B and 11B show vertical cross-sectional views at a position of the routing channel $6_k$ at which there is only one gate runner $2_i$ between two cell regions. The gate runner 2 in these figures may represent gate runner $2_{11}$ between cell regions $1_{11}$, $1_{12}$, gate runner $2_{12}$ between cell regions $1_{13}$, 114, or gate runner $2_{13}$ between cell regions $1_{15}$, 116 shown in FIGS. 1 to 3, for example. FIG. 12 shows a vertical cross section of routing channel $6_k$ at a position at which there are three gate runners $2_i$, $2_j$, $2_k$, wherein at this position only one of the gate runners $2_i$, $2_j$, $2_k$ is connected to the gate electrode 16 arranged below the gate runners $2_i$, $2_j$, $2_k$. The gate runners $2_i$, $2_j$, $2_k$ in FIG. 12 represent gate runners $2_{11}$, $2_{21}$, $2_{31}$ between cell regions $1_{31}$, $1_{32}$, gate runners $2_{12}$, $2_{22}$, $2_{32}$ between cell regions $1_{33}$, $1_{34}$, or gate runners $2_{13}$, $2_{23}$, $2_{33}$ between cell regions $1_{35}$, $1_{36}$ shown in FIGS. 1 to 3, for example.

Referring to FIG. 12, the gate runners $2_i$, $2_j$, $2_k$ are spaced apart from each other and insulated from each other in the routing channel $6_k$. Optionally, an insulating layer 57 of the type explained with reference to FIG. 8A may be arranged between the gate runners $2_i$, $2_j$, $2_k$.

Figure 13A:
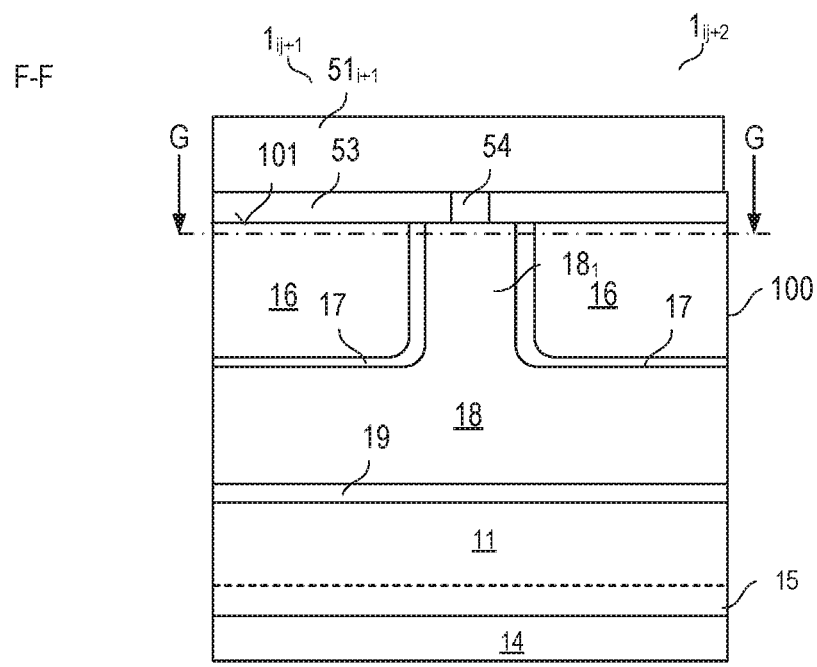
FIGS. 13A-13B illustrate one example for connecting the field electrodes of transistor cells in adjoining cell regions to a source electrode.
Figure 13B:
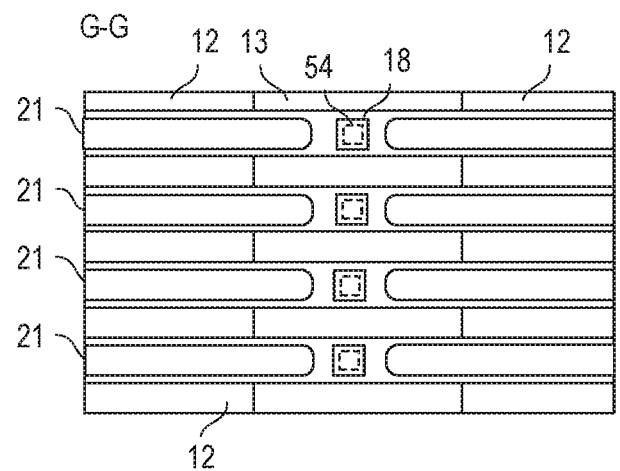

In the example shown in FIGS. 13A and 13B, the field electrode 18 includes a connection section $18_1$ that extends through the gate electrode 16 to the first surface 101, is insulated from the gate electrode 16 by a dielectric, and is electrically connected to the source electrode $51_{i+1}$. Referring to FIG. 13A, the connection section $18_1$ may be connected to the source electrode $51_{i+1}$ through an electrically conducting via 54 that is arranged in the insulation layer 53. Further, in this example, the connection section $18_1$ is arranged in the region of a border between two cell regions, the second cell region $1_{ij+1}$ and the third cell region $1_{ij+2}$ in this example, so that the connection section $18_1$ separates the gate electrodes 16 of the transistor cells in the neighboring cell regions $1_{ij+1}$, $1_{ij+2}$.

Figure 14:
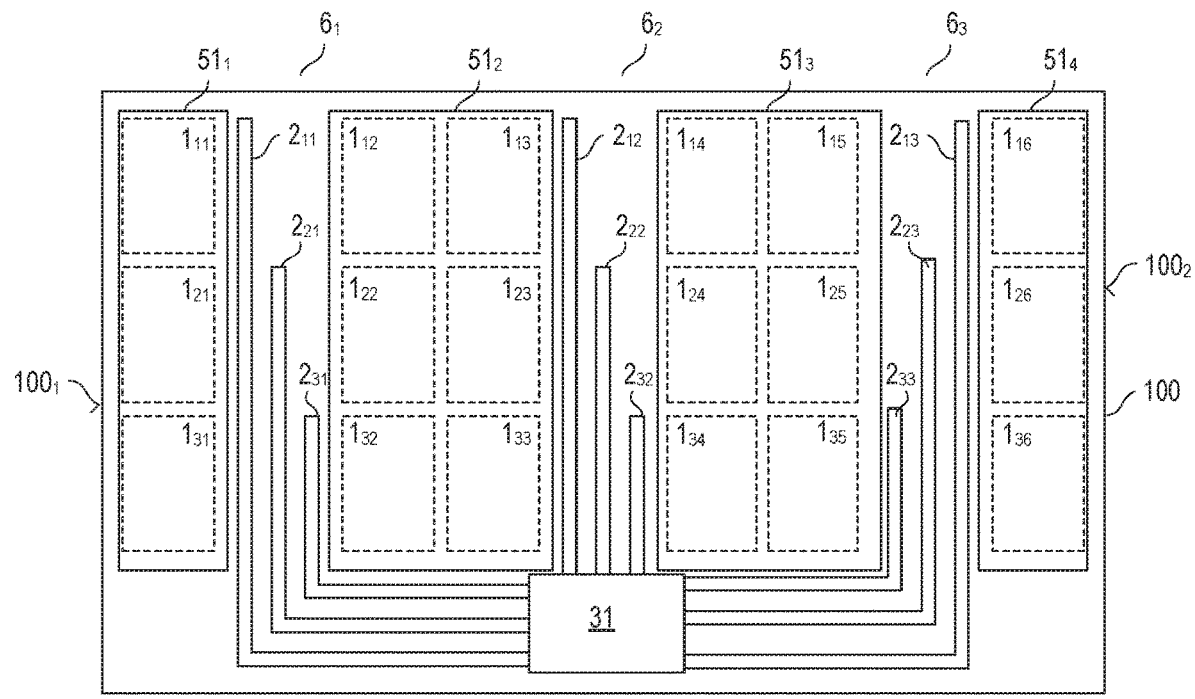
FIG. 14 illustrates a top view of a transistor device of the type shown in FIG. 1, wherein source electrodes are shown in addition to the gate pad and the gate runners.

As explained above the source regions 12 of the transistor cells 10 are connected to the source node S of the transistor device through one or more source electrodes. One example of a transistor device that includes several separate source electrodes $51_1$-$51_4$ is illustrated in FIG. 14 which shows a top view of the transistor device. Positions of the cell regions $1_{11}$-$1_{36}$ below the source electrodes $51_1$-$51_4$ is illustrated in dashed lines in FIG. 14. In the example shown in FIG. 14, the transistor device includes four source electrodes. This, however, is only an example. The number of source electrodes is arbitrary and dependent on the specific design of the transistor device.

In this example shown in FIG. 14, cell regions 1 arranged between two gate runner regions 6 or arranged between a gate runner region 6 and an edge of the semiconductor body 100 are connected to the same source electrode. More specifically, in the example shown in FIG. 14, cell regions $1_{12}$, $1_{13}$, $1_{22}$, $1_{23}$, $1_{32}$, $1_{33}$, for example, which are arranged between gate runner regions $6_1$, $6_2$ are connected to the same source electrode $51_2$. Cell regions $1_{11}$, $1_{21}$, $1_{31}$, for example, which are arranged between an edge $100_1$ of the semiconductor body 100 and gate runner region $6_1$ are connected to the same source electrode $51_1$. "A cell region being connected to a source electrode" means that the source regions 12 of the transistor cells 10 included in the cell region are connected to the source electrode 51 (wherein 51 denotes an arbitrary one of the source electrodes $51_1$-$51_4$).

Figure 15:
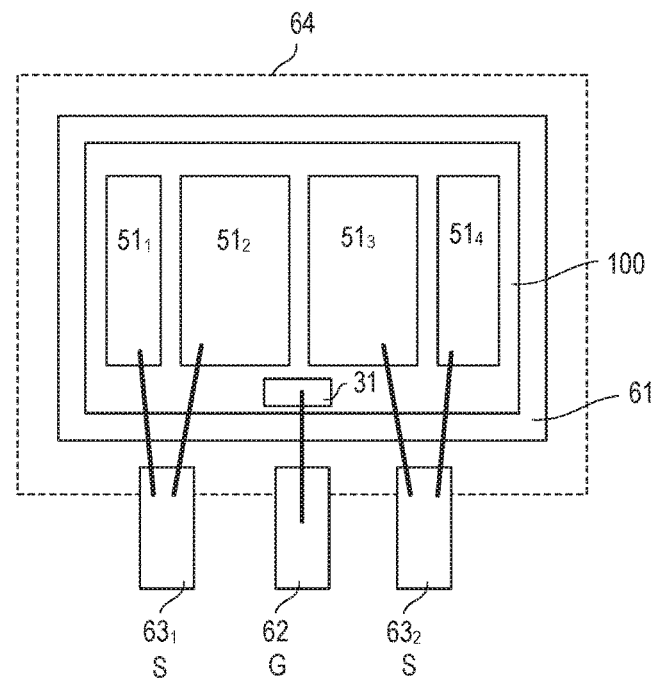
FIG. 15 illustrates a package that includes a transistor device of the type shown in FIG. 14.

In the example shown in FIG. 14, the source electrodes $51_1$-$51_4$ are spaced apart from each other so that there are several separate source electrodes $51_1$-$51_4$. These source electrodes may be connected to a source node S of the transistor device in various ways. One example is illustrated in FIG. 15, which shows a top view of the transistor device.

Figure 16A:
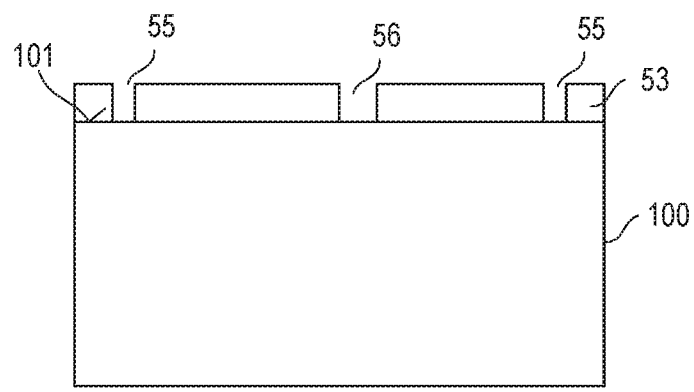
FIGS. 16A-16C illustrate one example of a method for forming the gate runners and the source electrodes.
Figure 16B:
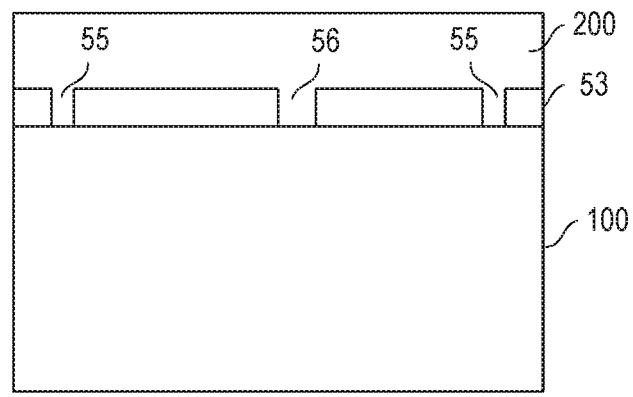
Figure 16C:
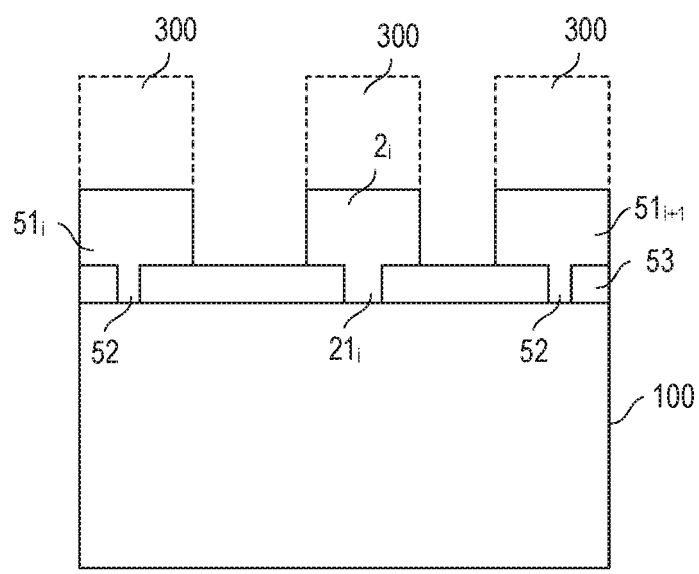

According to one example, the source electrodes 51 and the gate runners 2 are formed based on the same electrode layer in the same process. One example of such process is illustrated in FIGS. 16A-16C, wherein each of these FIGS. 16A-16C shows a vertical cross-sectional view of one section of the semiconductor body 100 during the manufacturing process. The semiconductor body 100 is only schematically illustrated in these figures, that is, transistor cells or other structural elements of the transistor device that are included in the semiconductor body 100 are not illustrated.

Referring to FIG. 16A, the method includes forming the insulation layer 53 on the first surface 101 of the semiconductor body 100 and forming first openings 55 and second openings 56 in the insulation layer 53. The first openings 55 serve to form the source connection vias 52 illustrated in FIG. 8B, and the second openings 56 serve to form the gate connection vias $21_i$ illustrated in FIG. 8C.

Referring to FIG. 16B, the method further includes forming an electrode layer 200 on top of the insulation layer 53 such that the electrode layer 200 covers the insulation layer 53 and fills the first and second openings 55, 56. Forming the electrode layer 200 may include a deposition process. In this process, a single electrically conducting layer may be deposited or two or more different electrically conducting layers may be deposited one above the other. By filling the first and second openings 55, 56 with the at least one electrically conducting layer the source connection vias 52 and the gate connection vias $21_i$ are formed.

Referring to FIG. 16C, the method further includes patterning the electrode layer 200 such that the source electrodes 51 and the gate runners 2 are formed, wherein in FIG. 16C only two source electrodes $51_i$, $51_{i+1}$ and one gate runner 2 are shown. Patterning the electrode layer 200 may include an etching process using a patterned etch mask 300 (illustrated in dashed lines in FIG. 16C).

Figure 17:
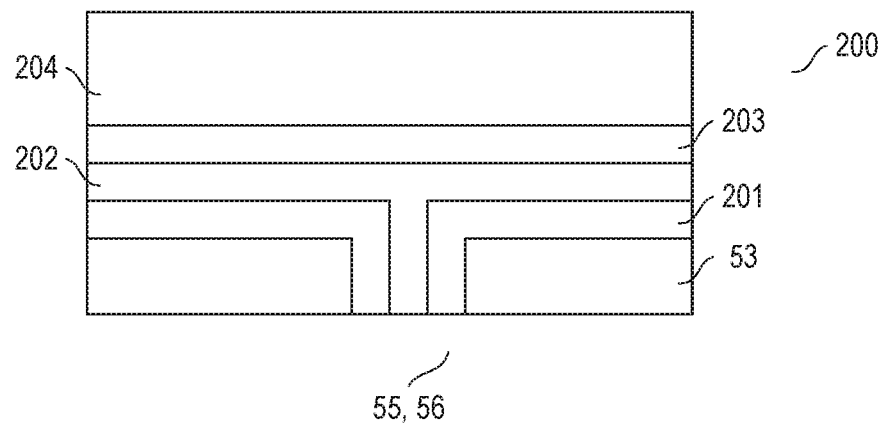
FIG. 17 illustrates one example of a conducting layer shown in FIG. 16B in greater detail.

Referring to the above, the electrode layer 200 may include a layer stack with two or more electrically conducting layers. One example of an electrode layer 200 including several electrically conducting layers is illustrated in FIG. 17. In this example, the electrode layer 200 includes a contact layer 201 that is configured to provide a contact to the source regions (not shown) and the gate electrodes. According to one example, the contact layer 201 includes at least one of titanium (Ti) and titanium nitride (TiN). A thickness of the contact layer 201 is between 50 nanometers (nm) and 100 nm, for example.

Further, the electrode layer 200 includes a filling layer 202 configured to fill residual openings after forming the contact layer 201 in the openings 55, 56. According to one example, the filling layer 202 includes at least one of titanium (Ti) and titanium nitride (TiN). A thickness of the filling layer is between 100 nanometers (nm) and 200 nm, for example.

Further, the electrode layer 200 may include a stress compensation 203 layer on top of the filling layer 202, and another contact layer 204. The contact layer 204 includes at least one of copper (Cu), aluminum (Al), or an Al—Cu-alloy (AlCu) and is configured to have connectors, such as bond wires or clips, connected thereto. A thickness of the contact layer 204 is between 2 micrometers (μm) and 5 micrometers (μm), for example. The stress compensation layer 203 compensates mechanical stress that may result from different thermal expansion coefficients of the contact layer 204 and the filling layer 202. A thickness of the stress compensation layer 203 is between 100 nanometers (nm) and 200 nm, for example. According to one example, the stress compensation layer 203 includes a titanium-tungsten alloy (TiW).

When the source electrodes 51 and the gate runners 2 are formed based on the same electrode layer 200 the resistances of the individual gate runners 2 can be adjusted by the width of the gate runners, given that the length of the gate runners is essentially given by the distance between the gate pad 31 and the respective cell regions 1. Additionally, the resistance between the pad 31 and the cell regions 1 can be adjusted by implementing one or more additional resistors 4. Referring to FIG. 3, these additional resistors may be arranged between the gate pad 31 and the gate runners 2. This, however, is only an example. According to another example, the gate runners 2 are split into two or more sections and the resistors 4 are connected between these two or more gate runner sections.

The number of cell regions 1 of the transistor device is arbitrary. According to one example, the transistor device includes between 4 and 20 cell regions 100. According to one example, the cell regions 1 essentially have the same size. "Essentially the same size" includes that the size of the individual cell regions deviates less than 20%, less than 10%, or even less than 5% from an average size of the cell regions 1.

The following examples may illustrate one or more aspects of the disclosure. The elements labeled in the examples below are non-limiting examples of the features described and the labeled elements are included only to illustrate some example features that may correspond to the elements recited in the examples.

Example 1—A transistor device, comprising: a semiconductor body (100); a plurality of cell regions (1) each comprising a plurality of transistor cells (10) that are at least partially integrated in the semiconductor body (100) and that each comprise a respective gate electrode (16); a plurality of routing channels (6) each arranged between two or more of the cell regions (1); a gate pad (31) arranged above a first surface (101) of the semiconductor body (100); and a plurality of gate runners (2) each coupled to the gate pad (31) and each arranged in one of the plurality of routing channels (6), wherein each of the plurality of gate runners (2) is associated with one of the plurality of cell regions (1) such that the gate electrodes (16) in each of the plurality of cell regions (1) are connected to an associated gate runner (2), and wherein each of the plurality of routing channels (6) comprises two or more gate runners (2) that are routed in parallel and spaced apart from each other.

Example 2—The transistor device of example 1, wherein each of the plurality of gate runners (2) is directly coupled to the gate pad (31).

Example 3—The transistor device of example 1, wherein at least one of the plurality of gate runners (2) is coupled to the gate pad (31) through a resistor (4).

Example 4—The transistor device of any examples 1-3, wherein each of the routing channels (6) further comprises an insulating material (57) electrically insulating the two or more gate runners (2) from each other.

Example 5—The transistor device of example 4, wherein the routing channel (6) is devoid of any further elements.

Example 6—The transistor device of any of examples 1-5, wherein the plurality of cell regions (1) are arranged in rows and columns, wherein each column comprises at least two cell regions that are arranged next to each other in a first lateral direction (x) and that are associated with different gate runners, and wherein each row comprises several cell regions that are arranged next to each other in a second lateral direction (y).

Example 7—The transistor device of example 6, wherein the transistor device comprises a plurality of trench electrodes each extending in the second lateral direction, and wherein each of the plurality of trench electrodes forms the gate electrodes (16) of transistor cells in different cell regions that are arranged next to each other in the second lateral direction (y).

Example 8—The transistor device of any of examples 1-7, wherein each of the plurality of gate runners (2) is connected to two of the plurality of cell regions.

Example 9—The transistor device of any of examples 1-8, further comprising: a plurality of source electrodes (51), wherein each of the plurality of source electrodes (51) is associated with two or more of the plurality of cell regions (1) such that source regions (12) of the plurality of transistor cells (10) in each of the plurality of cell regions (1) are connected to the associated source electrode (51).

Example 10—The transistor device of example 9, wherein the plurality of gate runners (2) and the plurality of source electrodes (51) are based on the same conducting layer or the same conducting layer stack (200).

Example 11—The transistor device of any of examples 1-10, wherein each of the plurality of gate runners (2) has a width and a height, and wherein the width is between 1 micrometer and 15 micrometers and the height is between 0.5 micrometers and 5 micrometers.

Example 12—The transistor device of any of examples 1-11, wherein the plurality of cell regions comprises between 4 and 20 cell regions.

Example 13—The transistor device of any of examples 1-12, wherein the transistor cells (10) are one of IGBT cells and MOSFET cells.

Example 14—A transistor device, comprising: a semiconductor body (100); a plurality of cell regions (1) each comprising a plurality of transistor cells (10) that are at least partially integrated in the semiconductor body (100) and that each comprise a respective gate electrode (16); a gate pad (31) arranged above a first surface (101) of the semiconductor body (100); and a plurality of gate runners (2), each gate runner (2) having a capacitance, a resistance and a propagation delay, the propagation delay being adjustable by adjusting at least one of the capacitance and the resistance, wherein each gate runner (2) of the plurality of gate runners (2) couples the gate electrodes (16) of one of the plurality of cell regions (1) to the gate pad (31).

Example 15—The transistor device of example 14, wherein the propagation delay of each of the plurality of gate runners (2) deviates less than 20%, less than 10%, or even less than 5% from an average propagation delay of the plurality of gate runners.

Various aspects have been described in this disclosure. These and other aspects are within the scope of the following claims.

The invention claimed is:

1. A transistor device, comprising:
a semiconductor body;
a plurality of cell regions each comprising a plurality of transistor cells that are at least partially integrated in the semiconductor body and that each comprise a respective gate electrode;
a plurality of routing channels each arranged between two or more of the cell regions;
a gate pad arranged above a first surface of the semiconductor body; and
a plurality of gate runners each coupled to the gate pad and each arranged in one of the plurality of routing channels, wherein each of the plurality of gate runners is associated with one of the plurality of cell regions such that the gate electrodes in each of the plurality of cell regions are connected to an associated gate runner, and wherein each of the plurality of routing channels comprises two or more gate runners that are routed in parallel and spaced apart from each other.

2. The transistor device of claim 1, wherein each of the plurality of gate runners is directly coupled to the gate pad.

3. The transistor device of claim 1, wherein at least one of the plurality of gate runners is coupled to the gate pad through a resistor.

4. The transistor device of claim 1,
wherein each of the routing channels further comprises an insulating material electrically insulating the two or more gate runners from each other.

5. The transistor device of claim 4, wherein the routing channel is devoid of any further elements.

6. The transistor device of claim 1,
wherein the plurality of cell regions are arranged in rows and columns,
wherein each column comprises at least two cell regions that are arranged next to each other in a first lateral direction and that are associated with different gate runners, and
wherein each row comprises several cell regions that are arranged next to each other in a second lateral direction.

7. The transistor device of claim 6,
wherein the transistor device comprises a plurality of trench electrodes each extending in the second lateral direction, and
wherein each of the plurality of trench electrodes forms the gate electrodes of transistor cells in different cell regions that are arranged next to each other in the second lateral direction.

8. The transistor device of claim 1,
wherein each of the plurality of gate runners is connected to two of the plurality of cell regions.

9. The transistor device of claim 1, further comprising:
a plurality of source electrodes,
wherein each of the plurality of source electrodes is associated with two or more of the plurality of cell regions such that source regions of the plurality of transistor cells in each of the plurality of cell regions are connected to the associated source electrode.

10. The transistor device of claim 9,
wherein the plurality of gate runners and the plurality of source electrodes are based on the same conducting layer or the same conducting layer stack.

11. The transistor device of claim 1,
wherein each of the plurality of gate runners has a width and a height, and
wherein the width is between 1 micrometer and 15 micrometers and the height is between 0.5 micrometers and 5 micrometers.

12. The transistor device of claim 1,
wherein the plurality of cell regions comprises between 4 and 20 cell regions.

13. The transistor device of claim 1,
wherein the transistor cells are one of IGBT cells and MOSFET cells.

14. A transistor device, comprising:
a semiconductor body;
a plurality of cell regions each comprising a plurality of transistor cells that are at least partially integrated in the semiconductor body and that each comprise a respective gate electrode;
a gate pad arranged above a first surface of the semiconductor body; and
a plurality of gate runners, each gate runner having a capacitance, a resistance and a propagation delay, the propagation delay being adjustable by adjusting at least one of the capacitance and the resistance, wherein each gate runner of the plurality of gate runners couples the gate electrodes of one of the plurality of cell regions to the gate pad.

15. The transistor device of claim 14, wherein the propagation delay of each of the plurality of gate runners deviates less than 20% from an average propagation delay of the plurality of gate runners.

16. The transistor device of claim 15, wherein the propagation delay of each of the plurality of gate runners deviates less than 10% from the average propagation delay of the plurality of gate runners.

17. The transistor device of claim 16, wherein the propagation delay of each of the plurality of gate runners deviates less than 5% from the average propagation delay of the plurality of gate runners.

* * * * *